United States Patent
Botma et al.

(10) Patent No.: US 7,432,517 B2
(45) Date of Patent: Oct. 7, 2008

(54) PULSE MODIFIER, LITHOGRAPHIC APPARATUS, AND DEVICE MANUFACTURING METHOD

(75) Inventors: Hako Botma, Eindhoven (NL); Joerg Bruebach, Eindhoven (NL); Mark Trentelman, Eindhoven (NL); Adel Joobeur, Milford, CT (US)

(73) Assignee: ASML Netherlands B.V., Veldhoven (NL)

( * ) Notice: Subject to any disclaimer, the term of this patent is extended or adjusted under 35 U.S.C. 154(b) by 211 days.

(21) Appl. No.: 11/270,898

(22) Filed: Nov. 10, 2005

(65) Prior Publication Data

US 2006/0126681 A1    Jun. 15, 2006

Related U.S. Application Data

(60) Provisional application No. 60/629,310, filed on Nov. 19, 2004.

(51) Int. Cl.
*G01R 23/02*    (2006.01)

(52) U.S. Cl. .............................. 250/504 R; 250/503.1; 250/493.1

(58) Field of Classification Search .................... 372/30; 250/504 R
See application file for complete search history.

(56) References Cited

U.S. PATENT DOCUMENTS

| | | | |
|---|---|---|---|
| 3,430,048 A | 2/1969 | Rubinstein | |
| 3,447,856 A | 6/1969 | De Lange | |
| 3,501,222 A | 3/1970 | Herriott et al. | |
| 4,313,647 A | 2/1982 | Takazawa | |
| 4,390,247 A | 6/1983 | Freyre | |
| 4,468,776 A | 8/1984 | McLellan | |
| 4,486,887 A | 12/1984 | Hoag et al. | |

(Continued)

FOREIGN PATENT DOCUMENTS

DE    100 63 976 A1    7/2002

(Continued)

OTHER PUBLICATIONS

Uwe Stamm et al., A "rF Excimer Laser for 193 nm Lithography", SPIE, vol. 3334, pp. 1010-1013.

(Continued)

*Primary Examiner*—Jack I. Berman
*Assistant Examiner*—Andrew Smyth
(74) *Attorney, Agent, or Firm*—Sterne, Kessler, Goldstein & Fox P.L.L.C.

(57) ABSTRACT

A pulse modifying unit is provided in the illumination system of the lithographic apparatus to reduce the degradation of the expensive lens elements by billions of the high intensity ultraviolet pulses from the laser is configured to receive an input pulse of radiation along a first optical axis and further configured to emit one or more corresponding output pulses of radiation along a second optical axis, including a divider disposed along the first optical axis and configured to divide the incoming pulse into a first and a second pulse portion, wherein the divider is further configured to direct the first pulse portion along the second optical axis. A first and a second mirror, each with a radius of curvature, are disposed facing each other with a predetermined separation, configured to receive the second pulse portion and to redirect the second portion along the second optical axis. The optical path of the second portion through the pulse modifier is longer than that of the first portion, and the separation is less than radius of curvature.

27 Claims, 13 Drawing Sheets

U.S. PATENT DOCUMENTS

| | | | |
|---|---|---|---|
| 4,511,220 A | 4/1985 | Scully | |
| 4,619,508 A | 10/1986 | Shibuya et al. | |
| 4,734,911 A | 3/1988 | Bruesselbach | |
| 4,896,952 A | 1/1990 | Rosenbluth | |
| 4,945,220 A | 7/1990 | Mallory et al. | |
| 4,948,212 A | 8/1990 | Cheng et al. | |
| 4,985,898 A | 1/1991 | Furuya et al. | |
| 5,005,969 A | 4/1991 | Kataoka | |
| 5,023,884 A | 6/1991 | Akins et al. | |
| 5,027,360 A | 6/1991 | Nabors et al. | |
| 5,075,893 A | 12/1991 | Epstein et al. | |
| 5,099,486 A | 3/1992 | Acharekar et al. | |
| 5,153,773 A | 10/1992 | Muraki et al. | |
| 5,220,454 A | 6/1993 | Ichihara et al. | |
| 5,233,460 A | 8/1993 | Partlo et al. | |
| 5,300,971 A | 4/1994 | Kudo | |
| 5,309,456 A | 5/1994 | Horton | |
| 5,312,396 A | 5/1994 | Feld et al. | |
| 5,315,604 A | 5/1994 | Chiu et al. | |
| 5,337,333 A | 8/1994 | Daly et al. | |
| 5,381,210 A | 1/1995 | Hagiwara | |
| 5,489,984 A | 2/1996 | Hariharan et al. | |
| 5,513,194 A | 4/1996 | Tamura et al. | |
| 5,559,816 A | 9/1996 | Basting et al. | |
| 5,617,434 A | 4/1997 | Tamura et al. | |
| 5,633,735 A | 5/1997 | Hunter, Jr. et al. | |
| 5,647,032 A | 7/1997 | Jutamulia | |
| 5,661,596 A | 8/1997 | Biro et al. | |
| 5,661,748 A | 8/1997 | Zahavi et al. | |
| 5,668,672 A | 9/1997 | Oomura | |
| 5,710,845 A | 1/1998 | Tajima | |
| 5,754,573 A | 5/1998 | Yarborough et al. | |
| 5,760,408 A | 6/1998 | Kikuchi et al. | |
| 5,815,247 A | 9/1998 | Poschenrieder et al. | |
| 5,852,621 A | 12/1998 | Sandstrom | |
| 5,880,817 A | 3/1999 | Hashimoto | |
| 5,891,605 A * | 4/1999 | Stanton | 430/296 |
| 5,912,999 A | 6/1999 | Brennan, III et al. | |
| 5,963,575 A | 10/1999 | Muller et al. | |
| 6,035,083 A | 3/2000 | Brennan, III et al. | |
| 6,043,920 A | 3/2000 | Leopold et al. | |
| 6,067,311 A | 5/2000 | Morton et al. | |
| 6,078,606 A | 6/2000 | Naiman et al. | |
| 6,108,140 A | 8/2000 | Hashimoto et al. | |
| 6,195,484 B1 | 2/2001 | Brennan, III et al. | |
| 6,275,514 B1 | 8/2001 | Katzir et al. | |
| 6,314,119 B1 | 11/2001 | Morton | |
| 6,381,256 B1 | 4/2002 | Stamm et al. | |
| 6,389,045 B1 | 5/2002 | Mann et al. | |
| 6,404,956 B1 | 6/2002 | Brennan, III et al. | |
| 6,535,531 B1 | 3/2003 | Smith et al. | |
| 6,549,267 B1 | 4/2003 | Kudo | |
| 6,574,036 B1 | 6/2003 | Raoult et al. | |
| 6,628,681 B2 | 9/2003 | Kubota et al. | |
| 6,643,312 B2 | 11/2003 | Kakizaki et al. | |
| 6,704,339 B2 * | 3/2004 | Lublin et al. | 372/57 |
| 6,904,073 B2 * | 6/2005 | Yager et al. | 372/57 |
| 6,940,073 B1 * | 9/2005 | Chai et al. | 250/373 |
| 2001/0021206 A1 | 9/2001 | Gross | |
| 2002/0075933 A1 | 6/2002 | Stamm et al. | |
| 2002/0122628 A1 | 9/2002 | Brennan, III et al. | |
| 2002/0153362 A1 | 10/2002 | Sandstrom et al. | |
| 2002/0186359 A1 | 12/2002 | Meisburger et al. | |
| 2003/0117601 A1 | 6/2003 | Kudo | |

FOREIGN PATENT DOCUMENTS

| | | |
|---|---|---|
| EP | 0 242 178 A2 | 10/1987 |
| EP | 0 552 093 A1 | 7/1993 |
| EP | 0 601 862 A1 | 6/1994 |
| EP | 1 069 453 A2 | 1/2001 |
| GB | 2 127 567 A | 4/1984 |
| GB | 2 245 790 A | 1/1992 |
| JP | 62-133788 A | 6/1987 |
| JP | 1-194375 | 8/1989 |
| JP | 1-198759 A | 8/1989 |
| JP | 1-292821 B2 | 11/1989 |
| JP | 3-196000 A | 8/1991 |
| JP | 4-351998 A | 12/1992 |
| JP | 6-29177 A | 2/1994 |
| JP | 6-214187 A | 8/1994 |
| JP | 7-210893 A | 8/1995 |
| JP | 2590530 B2 | 12/1996 |
| JP | 9-17725 A | 1/1997 |
| WO | WO 00/11765 A1 | 3/2000 |

OTHER PUBLICATIONS

Lambda Physik, "Scientific Lasers: Brilliant Performance for Science and Research", www.lambdaphysik.com (Jun. 9, 2004).

M. Rothschild et al., Applied Physics Letters, "Effects of excimer laser irradiation on the transmission, index of refraction, and desity of ultraviolet grade fused silica", American Institute of Physics, vol. 55 (No. 13), pp. 1276-1278, (Sep. 25, 1989).

Takashi Matsunaga et al., "Extreme high NA, High Throughput Scanner Compatible 4 kHz KrF excimer laser for DUV lithography", SPIE, pp. 1617-1626, (2001).

Palash Das et al., Proceedings of the IEEE: Special Issue On: Lasers In Microelectronics Manufacturing, "Advances in Excimer Laser Technology for Sub-0.25-um Lithography", IEEE, vol. 90 (No. 10), pp. 1637-1651, (Oct. 2002).

* cited by examiner

PULSE MODIFIER, LITHOGRAPHIC APPARATUS, AND DEVICE MANUFACTURING METHOD

CROSS REFERENCE TO RELATED APPLICATIONS

This application claims priority to U.S. application Ser. No. 60/629,310, filed Nov. 19, 2004, the entire contents of which are incorporated by reference.

BACKGROUND OF THE INVENTION

1. Field of the Invention

The present invention relates to a pulse modifier, a lithographic apparatus and a method for manufacturing a device 2. Description of the Related Art A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Lithographic apparatus include large expensive lens elements that are difficult to fabricate. Typically, an excimer laser is used to supply the lithographic apparatus with radiation in the form of pulses. The expensive lens elements are subject to degradation resulting from billions of these high intensity ultraviolet pulses. Optical damage is known to increase with increasing intensity (i.e., light power (energy/time) per cm2 or mJ/ns/cm2) of the pulses from the laser. The typical pulse length from these lasers is about 20 ns, so a 5 mJ laser pulse would have a pulse power intensity of about 0.25 mJ/ns (0.25 MW). Increasing the pulse energy to 10 mJ without changing the pulse duration would result a doubling of the power of the pulses to about 0.5 mJ/ns that could significantly shorten the usable lifetime of the lens elements.

A pulse stretching configuration has been proposed in U.S. Patent Application Publication 2004/0136417 A1 for use with a lithographic apparatus. In this application, the problem of optical damage is avoided by increasing substantially the pulse length from about 20 ns to more than 50 ns providing a reduction in the rate of optics degradation.

The pulse stretching unit from US Patent Application Publication 2004/0136417 A1 is shown in FIGS. 3 and 16: A 60R/40T beam splitter 10 reflects about 60 percent of the incoming radiation beam 100 into a delay path 40 formed by four focusing mirrors 20A, 20B, 2OC and 20D. The 40 percent transmitted portion of each pulse of beam 100 becomes a first sub-pulse of a corresponding stretched pulse in the outgoing beam 110. The reflected beam is directed by beam splitter 10 to mirror 20A which focuses the reflected portion to point 30. The beam then expands and is reflected from mirror 20B which converts the expanding beam into a parallel beam and directs it to mirror 20C which again focuses the beam again at point 30. This beam is then reflected by mirror 20D which like the 20B mirror changes the expanding beam to a light parallel beam and directs it back to beam splitter 10 where 60 percent of the first reflected light is reflected perfectly in line with the first transmitted portion of this pulse in outgoing beam 110 to become a second sub-pulse. 40 percent of the first reflected beam is transmitted by beam splitter 10 and follows exactly the path of the first reflected beam producing additional smaller sub-pulses in the outgoing radiation beam 110. By configuring the reflection coefficients and the path lengths, the resulting outgoing pulse is stretched from about 20 ns to about 50 ns.

In practice, the known pulse stretching unit, however, has the disadvantage that the lithographic apparatus needs considerable re-calibration after inserting the pulse modifier, which makes upgrading an apparatus in the field time-consuming. Additionally, the reliability will be low because of the need for calibration at regular intervals.

SUMMARY OF THE INVENTION

It is desirable to provide a pulse modifier that reduces the changes to the characteristics of the incoming radiation beam.

According to an aspect of the invention, there is provided a pulse modifier configured to receive an input pulse of radiation along a first optical axis and further configured to emit one or more corresponding output pulses of radiation along a second optical axis. The pulse modifier includes a divider disposed along the first optical axis and configured to divide the incoming pulse into a first and a second pulse portion, wherein the divider is further configured to direct the first pulse portion along the second optical axis; and a first mirror and a second mirror, each with a radius of curvature, disposed facing each other with a predetermined separation, configured to receive the second pulse portion and to redirect the second portion along the second optical axis, wherein the optical path of the second portion through the pulse modifier is longer than that of the first portion, and the separation is less than the radius of curvature.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIGS. 8a to 8f depict a pulse modifier according to an embodiment of the invention;

FIG. 16 depicts a pulse modifier.

DETAILED DESCRIPTION

Figure 1:
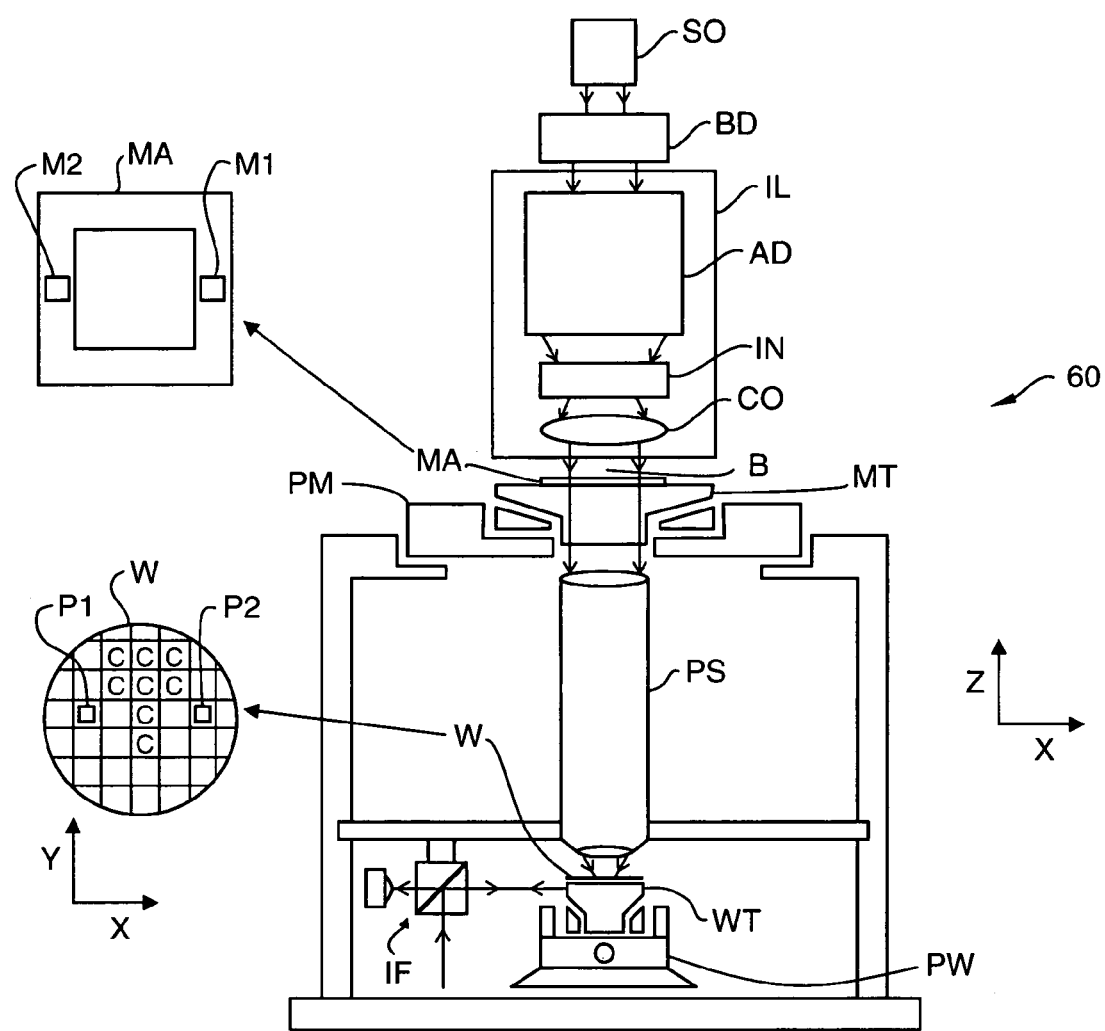
FIG. 1 depicts a lithographic apparatus according to an embodiment of the invention.

FIG. 1 schematically depicts a lithographic apparatus according to an embodiment of the invention. The apparatus includes an illuminator IL is configured to condition a radiation beam B (e.g. UV radiation or DUV radiation), and further configured to receive radiation from a source SO via a beam delivery system BD. At some point between the source SO and the illuminator IL, the radiation passes through a pulse stretching unit 50 which conditions the radiation for use in the lithographic apparatus. A support (e.g. a mask table) MT is constructed to support a patterning device (e.g. a mask) MA and is connected to a first positioner PM configured to accurately position the patterning device in accordance with certain parameters. A substrate table (e.g. a wafer table) WT is constructed to hold a substrate (e.g. a resist-coated wafer) W and connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including part of, one, or more dies) of the substrate W.

The division of the radiation path before the patterning device into a source SO, beam delivery BD and illuminator IL is somewhat arbitrary, it can be related to technical features or it can be related to the fact that parts and units are supplied by different manufacturers. For example, the source SO and lithographic apparatus may be supplied by different manufacturers (as is currently the practice the case for laser sources) or the source SO may be integrated within the lithographic apparatus (as is currently the practice for UV systems with a mercury lamp). For convenience, the term "illumination system" will be used to describe the collection of parts and units disposed in the optical path before the patterning device In the example of FIG. 1, the illumination system would thus include the source SO, the beam delivery BD and the illuminator IL.

The illumination system may include various types of optical components, such as refractive, reflective, magnetic, electromagnetic, electrostatic or other types of optical components, or any combination thereof, to direct, shape, or control radiation.

In a lithographic apparatus, the illumination system may have the capability to generate an illumination pupil which is matched to the structures on the patterning device (e.g. lines or contact holes) which need to be projected. The illuminator IL may include an adjuster AD configured to adjus the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

Figure 14A:
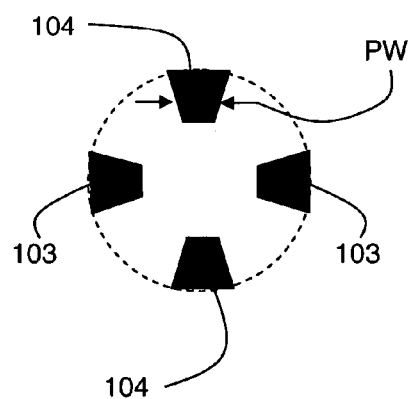
FIGS. 14a and 14b depict the possible effect of beam divergence on the illumination pupil of a lithographic projection apparatus.
Figure 14A:
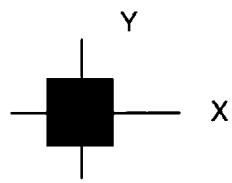

The cross-section of a possible illumination pupil is shown in FIG. 14a. Four equal poles 103 of radiation are created and disposed symmetrically about the optical axis of the system. The center of the pupil contains no radiation, and the poles 103 are arranged in a cross. The illumination pupil is formed in a conventional way by optical and diffractive optical elements (DOE's) disposed in the radiation beam. Also shown in FIG. 14a is a rectangular cross-section of a radiation beam, with a predetermined size in X and Y. The symmetry of the cross-section of the radiation beam creates four poles 103, each with substantially the same pole widths (PW). Although shown here as symmetrical, the beam cross-section may also be asymmetrical, such as is the case when using a laser for a source SO. This is typically not a problem because the illumination system may be designed to work with an asymmetrical radiation beam, and to create the desired illumination pupil when the beam has the expected profile.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Figure 2A:
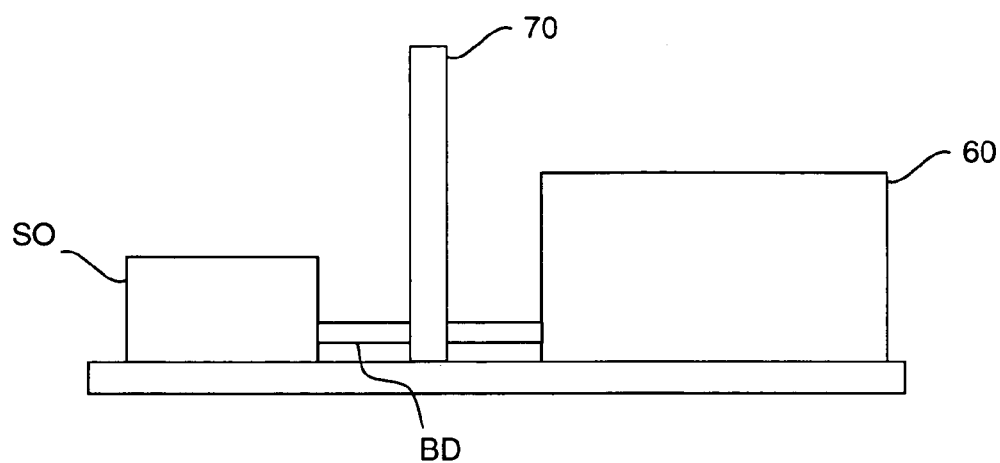
FIGS. 2a and 2b depict configurations for a source and a lithographic apparatus according to the invention.
Figure 2B:
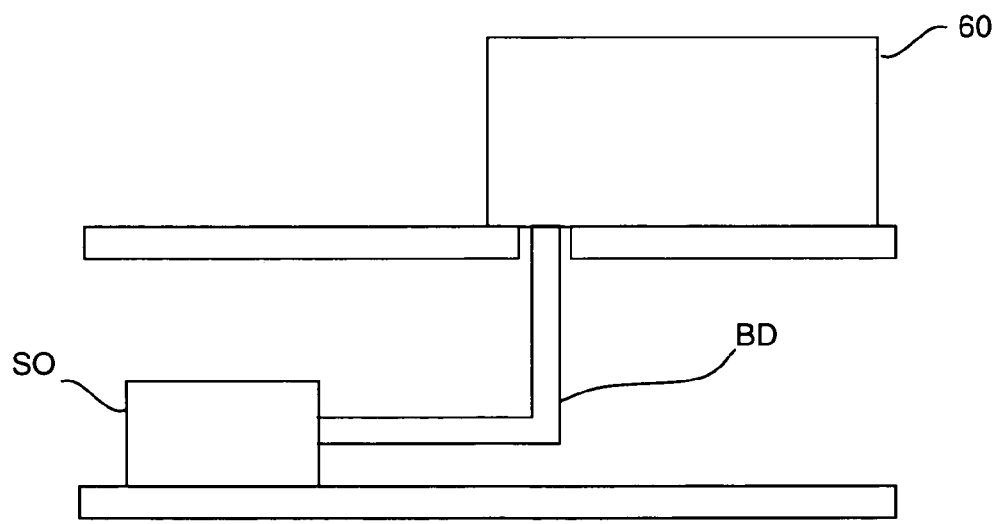

Referring to FIG. 1, the illuminator IL receives radiation from a radiation source SO. As already mentioned, the source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. As shown in FIG. 2a, this offers the flexibility of placing the source SO and the lithographic apparatus 60 in separate rooms, typically the lithographic apparatus is placed inside a clean-room wherein considerable effort is spent keeping the ambient number of particles low, and the source SO is placed in a service area where cleanliness is maintained to a much lower degree. As shown in FIG. 2b, it is even possible to use a lower floor as a service area, and to place the source SO there.

Figure 3:
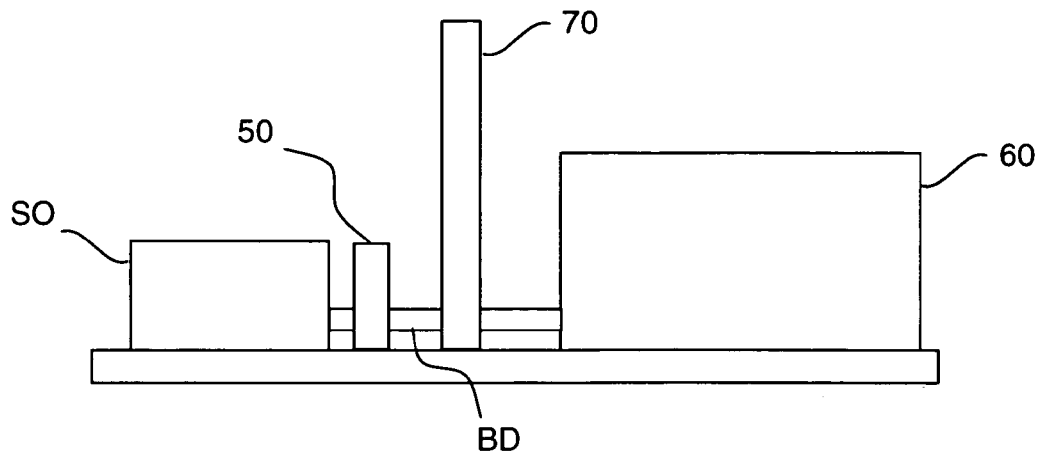
FIGS. 3 and 16 show a pulse modifier configuration disposed in the illumination system of a lithographic apparatus according to the prior art.
Figure 10A:
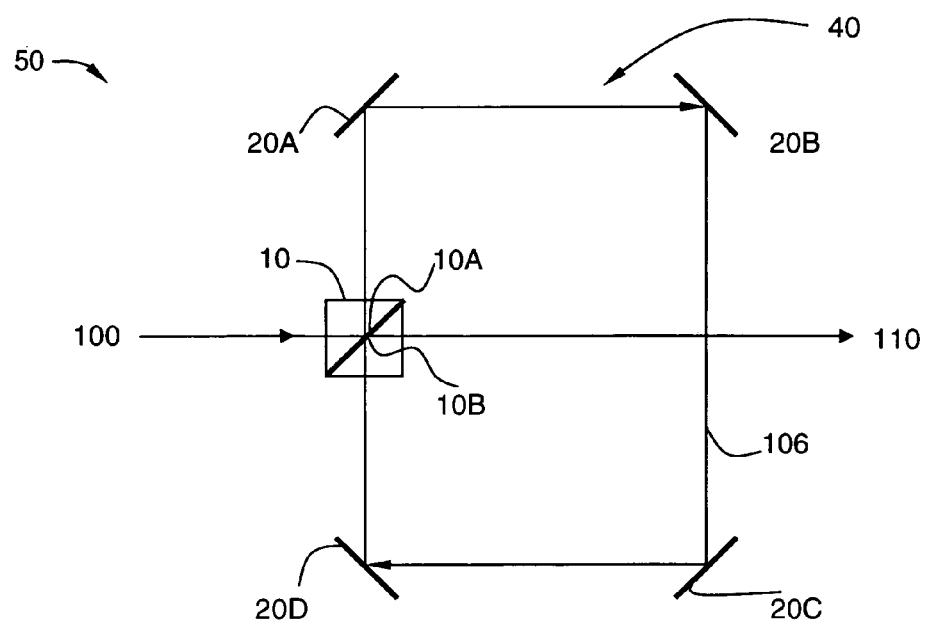
FIGS. 10a to 10c depict a pulse modifier according to an embodiment of the invention.
Figure 10B:
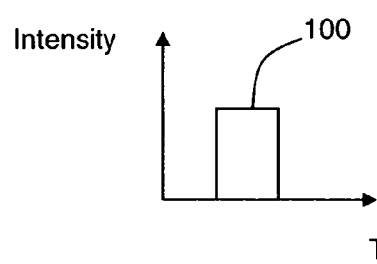
Figure 10C:
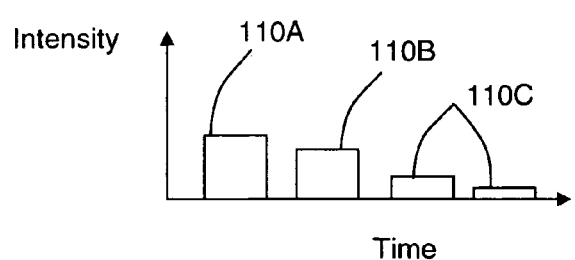

The illumination system includes a pulse modifier 50, which may be placed close to the source SO as shown in FIG. 3. The pulse modifier is shown in FIG. 10a and a schematic representation of the input and resulting output pulses are shown in FIGS. 10b and 10c, respectively.

Four planar mirrors 20A, 20B, 20C, 20D are disposed such that lines connecting the center of each mirror face form a rectangle. Each mirror is oriented such that its longitudinal axis makes an angle of approximately 45 degrees with the sides of the rectangle. A beam splitter 10 is disposed with the center of the splitter on one of the sides of the rectangle, and the longitudinal axis of the splitter makes an angle of 45 degrees with the sides of the rectangle. The beam splitter 10 is further disposed such that the center of the splitter lies on an optical axis, and the longitudinal axis of the splitter also makes an angle of 45 degrees with the optical axis.

During operation, the pulse modifier receives an incoming pulse 100, and divides it into one or more output pulses 110A, 110B, 110C with peak intensities which are lower than the peak intensity of the incoming pulse 100. The incoming pulse of radiation 100 enters the pulse modifier along the optical axis. The beam splitter 10 divides the pulse into a first portion, reflected by the beam splitter and a second portion, transmitted by the beam splitter. The first portion is reflected by each mirror 20A, 20B, 20C, 20D along the sides of the rectangle, and back to the splitter. The second portion leaves the pulse modifier 50 along the optical axis as an output pulse 110A. The first portion is divided by the splitter 10 into a third portion, reflected by the splitter 10 and a fourth portion, transmitted by the splitter 10. The third portion leaves the pulse modifier 50 along the optical axis as an output pulse 110B, but at a later instance than the second portion 110A due to the extra distance traveled around the delay path 40. The fourth portion travels along the same delay path 40 along the sides of the rectangle, and back to the splitter where it is again divided. This cycle repeats until the pulse energy is dissipated.

If, for example, a 60R/40T (60% reflection/40% transmission) beam splitter 10 is used, and assuming negligible losses at the splitter 10 and mirrors 20, the first portion represents 60 percent of the incoming radiation pulse 100. The second portion exits the pulse modifier 50 as the first output pulse 110A with about 40 percent of the peak intensity of the input pulse 100. The third portion leaves the pulse modifier 50 as the second output pulse 110B with about 36 percent of the peak intensity of the input pulse 100. The fourth portion, which represents about 24 percent of the incoming radiation pulse 100 leaves the pulse modifier 50 as several smaller output pulses which include 110C shown in FIG. 10c.

The time separation between the output pulses 110A, 110B, 110C is influenced by the length of the delay path 40 i.e. the distance the pulse travels between the first surface 10A and the second surface 10B of the splitter 10. This distance can be chosen to create overlapping, adjacent or separated output pulses. The relative intensity of the output pulses with respect to the input pulse and with respect to each other is influenced by the reflection/transmission ratio of the beam splitter. In practice, mirror and splitter losses will also influence the relative intensities, but to a lesser extent. The output pulses 110 are not separated spatially, the pulse modifier 50 is designed such that the output pulses are emitted along the optical axis.

The elements of the pulse modifier thus include a splitter 10 and a delay path 40. In many cases, a recombiner is also required to direct the delayed portions to the output 110. As shown in FIG. 10a, the beam splitter 10 provides both a splitting surface 10A or 10B, and a recombining surface 10B.

In practice, the input pulse shape is more complex than a simple step function, and the train of output pulses makes it difficult to calculate the effective pulse duration. It is simpler to calculate the "time integral square" (TIS) pulse length using the following formula:

$$TIS = \frac{\sum (I(t)dt)^2}{\sum (I^2(t)dt)}.$$

The TIS factor can be calculated for the pulse modifier to indicate the degree of stretching:

TIS Factor=TISout/TISin.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4A:
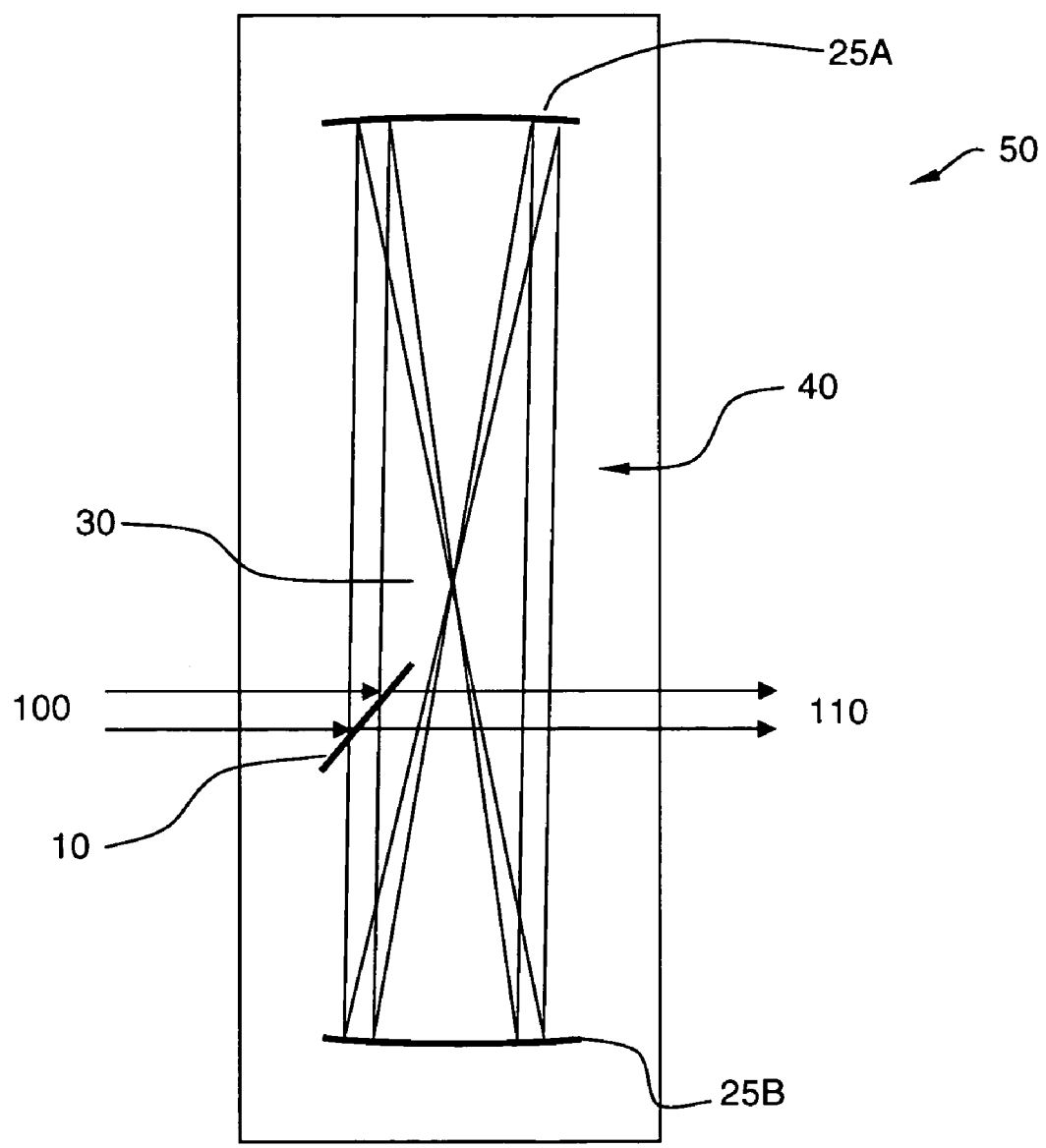
FIGS. 4a to 4c depicts a pulse modifier according to an embodiment of the invention.

A second embodiment of the pulse modifier is shown in FIG. 4a. Two concave mirrors 25A and 25B are disposed such that their reflective surfaces are facing each other. The mirrors are separated by a predetermined distance (separation), which is approximately equal to the radius of curvature of each mirror 25. Each mirror 25 is disposed symmetrically about a mirror axis, and the longitudinal axis of each mirror is arranged to be perpendicular to the mirror axis. A second axis, parallel to the mirror axis, contacts the surface of each mirror 25 at a predetermined distance from the mirror axis.

A beam splitter 10 is disposed along the second axis such that the longitudinal axis of the splitter 10 makes an angle of 45 degrees with the second axis. The beam splitter 10 is also disposed with its center on an optical axis, and the optical axis lies perpendicular to the second axis.

The pulse modifier operates in similar way to that of the first embodiment. During operation, an input pulse 110 enters the pulse along the optical axis.

An optical delay path 40 is formed by two mirrors 25A and 25B. Each is, for example, a 100 mm diameter spherical mirror with a large radius of curvature of approximately 1800 mm, separated by an optical cavity length of approximately 1800 mm. The beam splitter 10 makes a 45 degree angle with the incoming beam 100 and is disposed such that a portion of the incoming radiation 100 is reflected into the delay path 40, and such that radiation exiting the delay path 40 is reflected out of the pulse modifier into an output radiation beam 110. If, for example a 60R/40T beam splitter 10 is used, the beam splitter 10 reflects about 60 percent of the incoming radiation beam 100 into the delay path 40. The 40 percent transmitted portion of each pulse of beam 100 becomes a first sub-pulse of a corresponding stretched pulse in the outgoing beam 110. The reflected beam is directed by beam splitter 10 to mirror 25A which directs the reflected portion to mirror 20B, which in turn directs it back to beam splitter 10 where 60 percent of the first reflected light is reflected perfectly in line with the first transmitted portion of this pulse in outgoing beam 110 to become a second sub-pulse. 40 percent of the first reflected beam is transmitted by beam splitter 10 and follows exactly the path of the first reflected beam producing additional smaller sub-pulses in the outgoing radiation beam 110.

By configuring the beam splitter transmission/reflection coefficient and the varying the path lengths, the resulting outgoing pulse may be stretched by different degrees. For example, with a delay path 40 of 7.2 m and a 50R/50T beam splitter 10, an incoming pulse 100 of TIS 70 ns may be stretched into a pulse in the outgoing beam 110 with a TIS of 110 ns.

It is desirable to make a pulse modifier that reduces the changes to the characteristics of the incoming radiation beam. These characteristics include: energy per pulse, beam size, divergence and polarization. The energy per pulse is maintained to a high degree (>80%) by utilizing mirrors with a high degree of reflectivity (>98%) and beam splitters with low loss (<2%). Polarization is maintained by using a stress-free mounting of CaF2 beam splitters with almost no intrinsic birefringence. The beam size is conserved by the unity magnification of the cavity delay loop 40 and by keeping the divergence low.

Figure 14B:
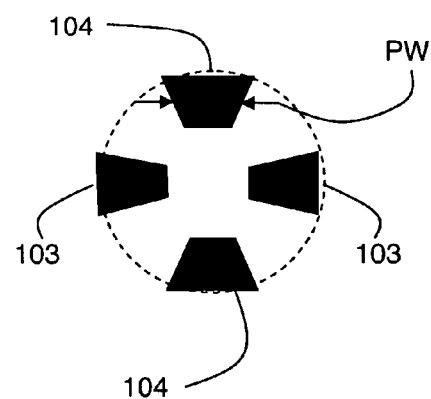
Figure 14B:
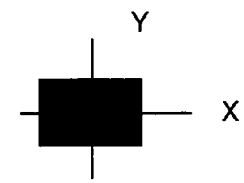

There are at least three contributions to the divergence: the divergence of the radiation from the source SO (e.g. the laser), the diffractive optical element DOE which is illuminated by the radiation from the source SO and the optical elements in the illuminator which are controlled to produce an illumination pupil with a predetermined shape and size. The divergence of the laser is convoluted with the pupil from the DOE-element and thus can distort the illumination pupil. Divergence differences in the orientations transverse to the optical axis are usually called X and Y. They are disadvantageous because they may break the symmetry of the illumination pupil as shown in FIG. 14b. FIG. 14b depicts an illumination pupil that has been allowed to diverge in X more than Y. Not only is the pole width (PW) of the top and bottom pole increased, but the shape of the left and right poles has been distorted. As mentioned previously, the illumination pupil is usually chosen to match the features on the patterning device. Large deviations may mean a decrease in the quality of the imaging on the substrate.

Figure 4B:
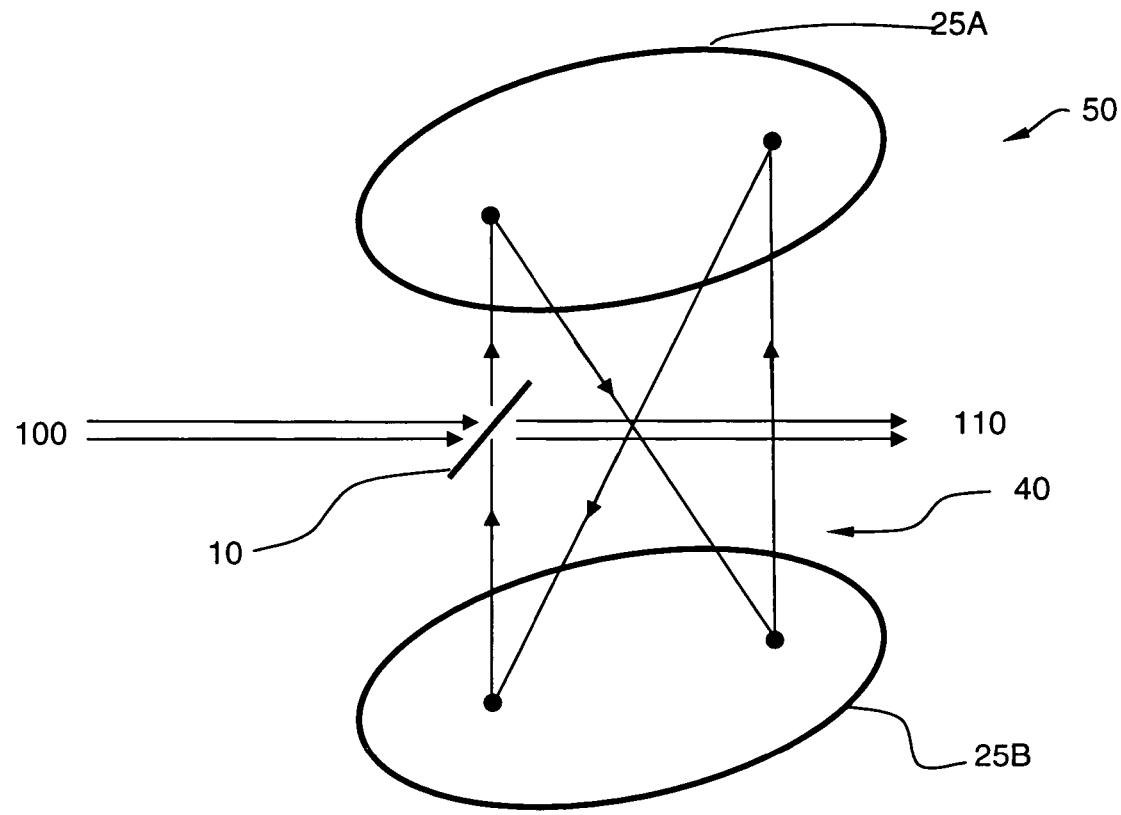

As shown in FIG. 4b, the 60 percent reflected portion travels the cavity length four times in a diabolo-shaped curve before it hits the beam splitter 10 again. In the paraxial approximation this optical cavity is stable: a ray which travels the diabolo-shaped delay loop 40 is returned to the same position on the beam splitter 10 with the same angle. In practice, this paraxial approximation may not hold and, consequently, the ray will not return with the same angle. This change in angle may cause a change in the divergence of the beam, and may lead to deterioration in the quality of the imaging on the substrate as previously explained.

Figure 13:
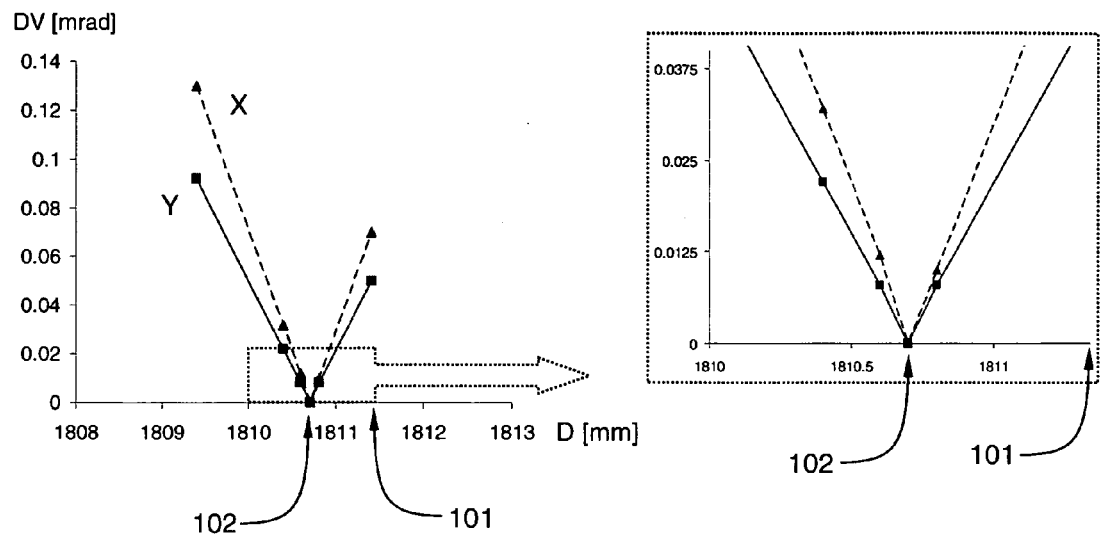
FIG. 13 depicts the effect on beam divergence due to changes in the mirror separation distance for two different beam delivery lengths.

The angles, and thus the divergence, can be conserved if the cavity length D is slightly detuned from the paraxial resonance condition i.e. D=F. FIG. 13 shows the relationship between divergence (DV) and the transverse cross-sections X and Y as the distance between the mirrors (D) is varied. The minimum amount of divergence DV occurs at 102 when the distance D is less than the resonant condition 101—the amount of divergence DV being approximately zero. For this example, the mirrors 25A and 25B have a radius of curvature F of 1811.4 mm. The expected optimum distance 101 between the mirrors is expected to be 1811.4 mm, but the graph of FIG. 13 shows the optimum distance between the mirrors 102 to be 1810.7 mm. This is a difference of −0.7 mm.

This minimization of divergence makes the pulse modifier optically 'transparent': adding a pulse modifier between an existing source and lithographic apparatus does not require any re-alignment of laser nor equipment.

Figure 16:
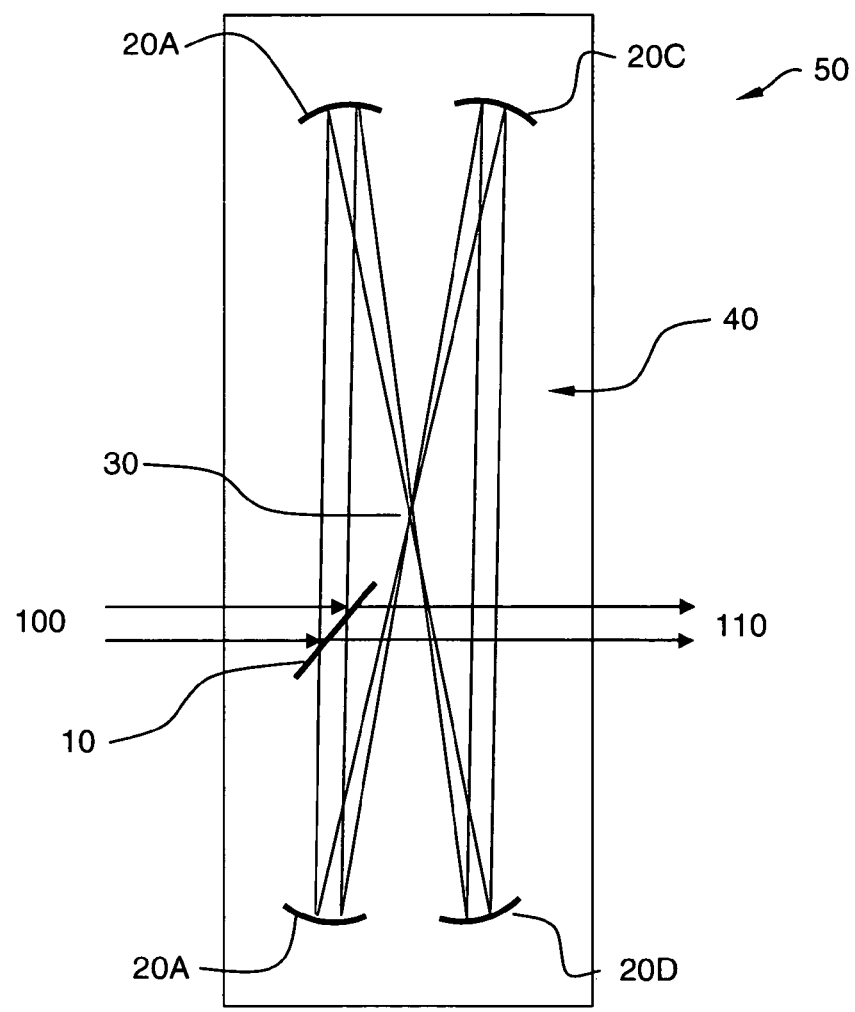
Figure 4C:
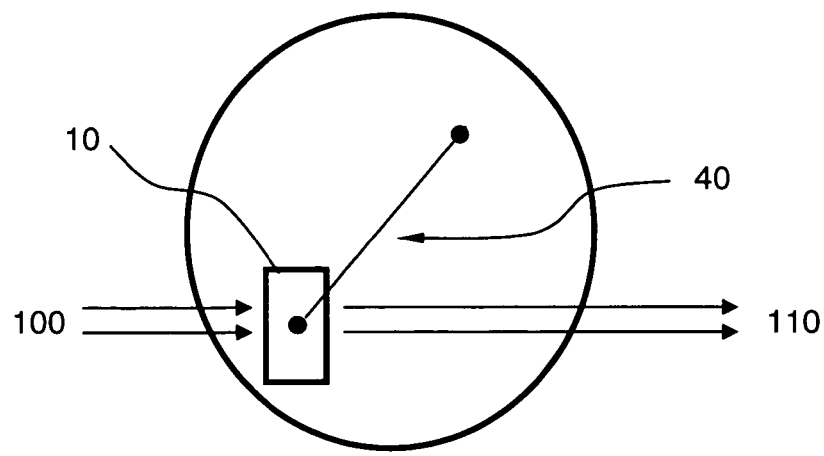

Known configurations with many mirrors, such as that shown in FIG. 16, require manipulators to align the pulse modifier, and in many cases active manipulation is required during operation to maintain the alignment. This leads to an increase in complexity with a consequent decrease in reliability. An additional advantage of the pulse stretching unit of FIG. 4a to 4c is that only two mirrors are used 25A, 25B compared to four mirrors 20A, 20B, 20C, 20D of the known pulse modifier, described in relation to FIG. 16.

This means that the alignment of the radiation beam through the invention is much simpler and remains more stable during its lifetime. This is useful when the distance between the source SO and the lithographic apparatus is quite large, such as when the source SO is placed in a separate room or on a different floor. Small shifts or divergence close to the source SO result in an amplified error when the radiation beam enters the lithographic apparatus.

It may be advantageous to include active "steering" mirrors in the optical path to further minimize any remaining beam disturbances. These may be placed at any convenient position within the pulse modifier, or at any convenient point in the beam delivery BD between the source and the lithographic apparatus.

The radiation used may have a wavelength that is strongly absorbed by oxygen—this is especially true at the shorter DUV wavelengths of 193 nm en 157 nm. It may therefore be advantageous to enclose the radiation beam path with a gas such as nitrogen that provides much lower beam attenuation than air. Purging systems for enclosures, such as the beam delivery BD or the pulse stretching unit 50 may include a source of gas, a supply valve in the connection to the enclosure and control means to ensure, for example, a constant flow of gas into the enclosure. The enclosure may also include a pressure detector in the enclosure and further control means to maintain a constant pressure within the enclosure.

It may be advantageous to provide actuators for the beam splitter 10 such that it can be moved in and out of the incoming radiation beam 100. This makes it possible to switch the pulse modifier in and out on demand.

Although FIG. 4a shows a delay path wherein the radiation travels four times between the mirrors, the invention can easily be modified so that radiation transits more than four times between the mirrors, thus increasing the delay path 40 without greatly changing the dimensions of the pulse stretching unit.

Figure 11:
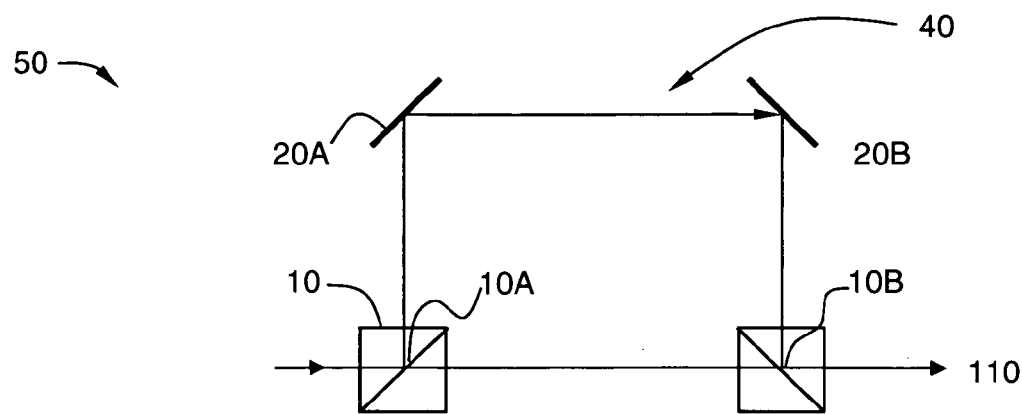
FIG. 11 depicts the use of a second beam splitter as a recombiner in a pulse modifier in which beam division is based upon polarization.
Figure 12:
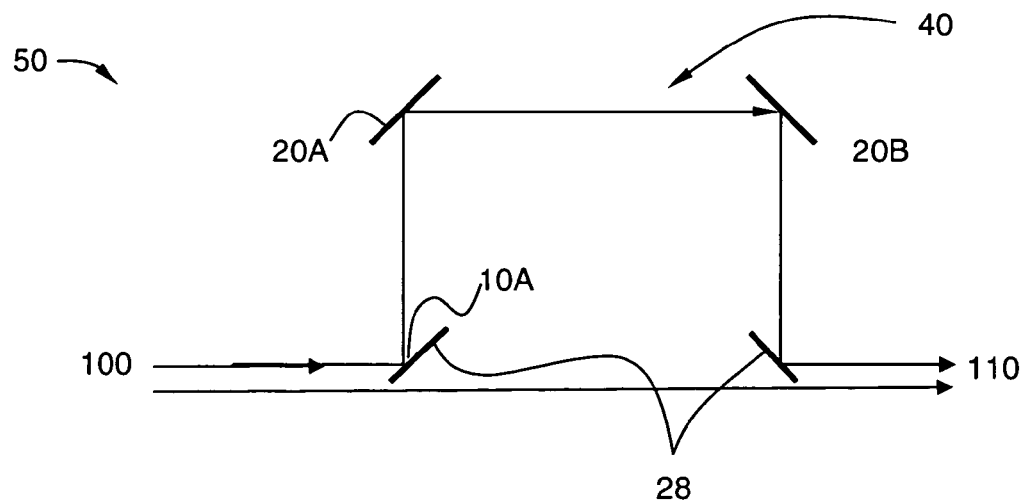
FIG. 12 depicts geometrical beam division according to an embodiment of the invention.

The beam splitter 10 may use one of the following techniques to split or divide the incoming radiation beam 100: based upon energy, using e.g. a 60R/40T beam splitter cube as just described; or based upon a property of the incoming radiation, such as polarization which is depicted in FIG. 11. In this pulse modifier, the incoming radiation beam 100 is split into two portions based upon polarization. One polarization is allowed to pass through the pulse modifier undelayed, but the other polarization is delayed by deflecting it through the delay path 40, before finally recombining it with the first polarization, to create an outgoing radiation beam 110 including both polarizations. Other techniques may be based upon a position (geometrically), such as that depicted in FIG. 12. Here a portion of the beam is redirected into a delay path 40 by inserting a suitable reflector 28 into a portion of the incoming radiation beam 100. The outgoing radiation beam 110 includes a delayed portion and an undelayed portion. This configuration does not require a recombination surface.

Figure 5A:
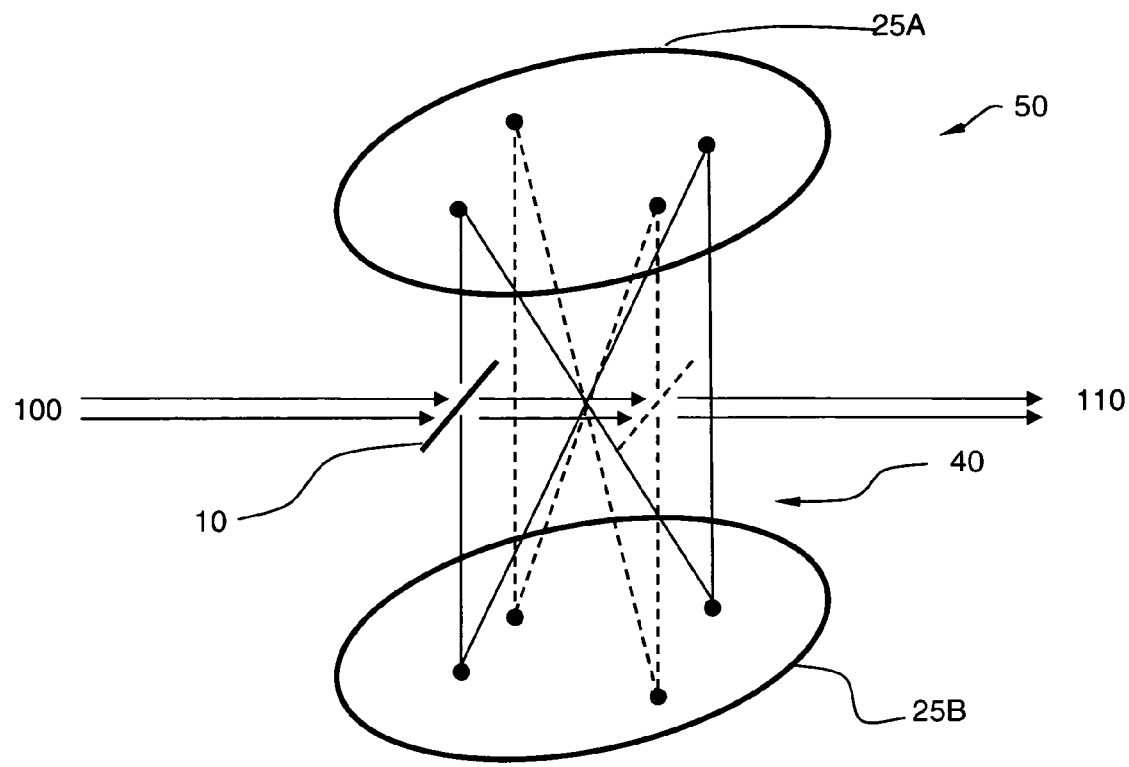
FIGS. 5a and 5b depict a pulse modifier unit including two cascaded pulse modifiers according to an embodiment of the invention.
Figure 5B:
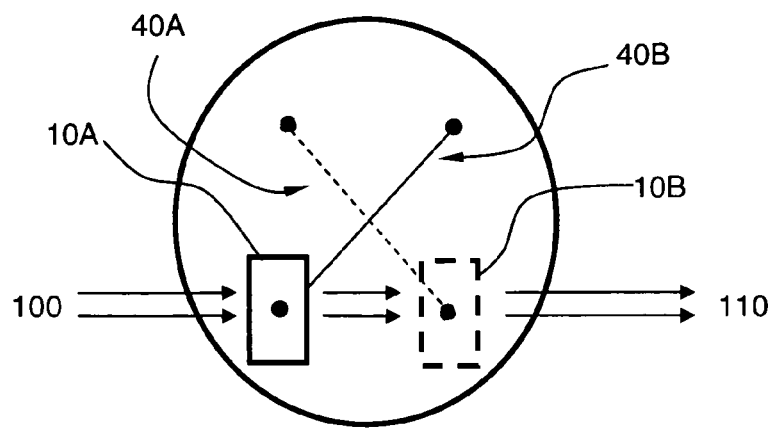

Another embodiment is depicted in FIGS. 5a to 5b. A first beam splitter 10A is disposed in the path of an incoming pulsed radiation beam 100. A first optical delay path 40A is formed by two almost-planar mirrors 25A, 25B. The first beam splitter 10A is disposed such that a portion of the incoming radiation 100 is reflected into the first delay path 40A, such that a portion of the incoming radiation beam 100 is transmitted towards a second beam splitter 10B, and such that radiation exiting the first delay path 40A is reflected towards the second beam splitter 10B.

A second optical delay path 40B is formed by the same two mirrors 25A, 25B. The second beam splitter 10B is disposed such that a portion of the radiation from the first beam splitter 10A is reflected into the second delay path 40B, such that a portion of the radiation from the first beam splitter 10A is transmitted out of the pulse modifier into the outgoing radiation beam 110, and such that radiation exiting the second delay path 40B is also reflected into the output radiation beam 110.

Figure 6:
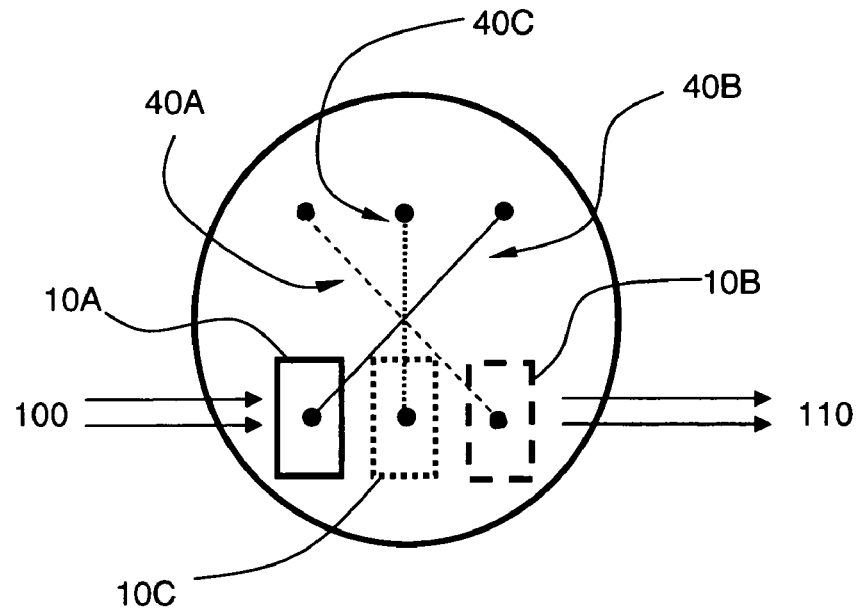
FIG. 6 depicts a pulse modifier unit including three cascaded pulse modifiers according to an embodiment of the invention.

It is thus possible to form two or more delay paths 40A, 40B using the same mirrors and an additional beam splitter 10A, 10B. Adding delay paths 40A, 40B increases the overall stretching of the input radiation pulses 100 without significantly affecting the size of the pulse stretching unit. For example, with two delay paths 40A, 40B of 7.2 m and two 50R/50T beam splitters, an incoming pulse 100 of TIS 70 ns may be stretched into a pulse in the outgoing beam 110 with a TIS of 150 ns. Similarly, the addition of a third delay path 40C (as shown in FIG. 6) of 7.2 m and a third 50R/50T beam splitter may further increase the TIS of the outgoing pulse 110 to 180 ns. This provides a space-saving alternative to cascading pulse modifiers with their own mirrors, and it will be obvious the skilled artisan that several delay paths may be created between the same mirrors without the delay paths intersecting.

Figure 7:
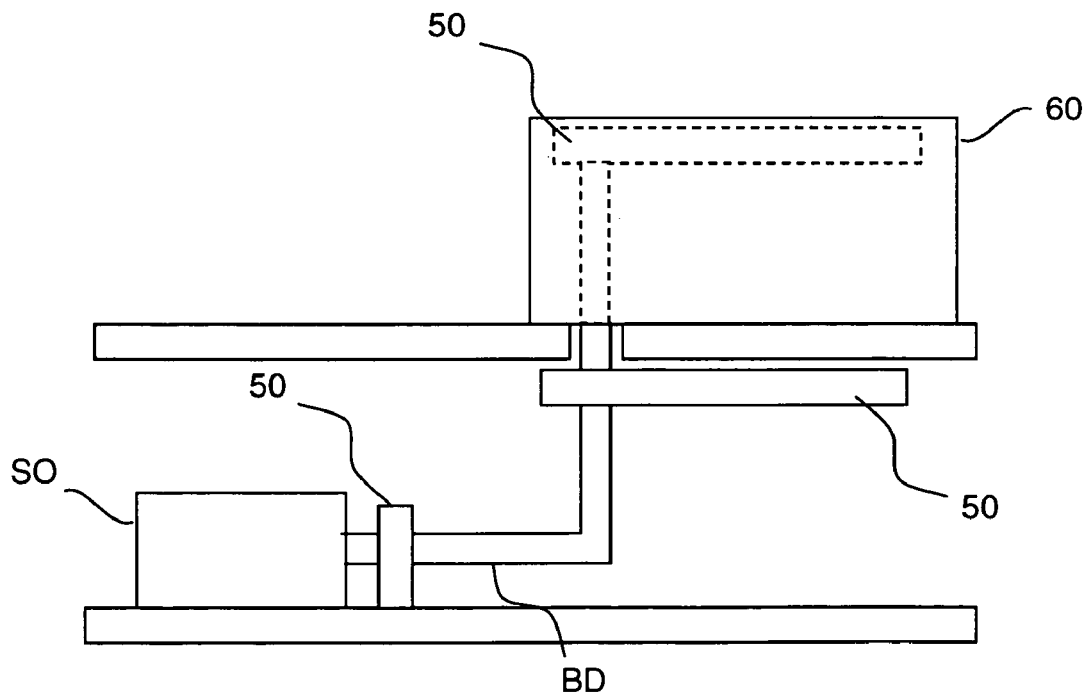
FIG. 7 depicts locations for a pulse modifier according to the invention in the illumination system of a lithographic apparatus.

For known pulse modifiers that significantly affect the divergence of the beam, the number of pulse modifiers that can be cascaded is very limited in lithographic applications. Using the invention, however, many pulse modifiers can be connected in series and using the same cavity. It also becomes feasible to use more than one pulse modifier in a lithographic apparatus. As mentioned earlier, the amount of stretching depends indirectly on the amount of room available to mount a pulse modifier. In some cases, it may be advantageous to employ a plurality of pulse modifiers 50 at different locations in the illumination system as shown in FIG. 7, for example, close to the source (at the start of the beam delivery BD, under the source, on top of the source etc), close to the exposure unit (for example fixed to a ceiling, as part of the clean-room floor etc) or as part of the exposure unit (for example, on top of the exposure unit). It should be appreciated appreciate that a pulse modifier 50 may be placed anywhere between the actual point of light generation within the source SO and the point where the beam is patterned. Any reduction in power due to mirror losses in the additional pulse modifiers 50 may be compensated by increasing the power output of the source SO.

It may be advantageous to provide the beam splitters 10A, 10B with actuators such that they can be moved in and out of the radiation beam. The pulse modifier may then be switched in and out, or the amount of stretching may be selected by activating or deactivating individual delay paths 40A, 40B.

Figure 15A:
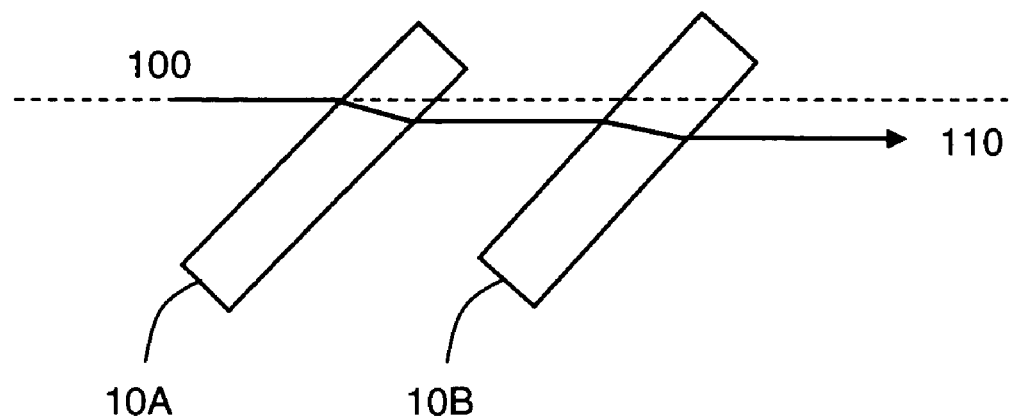
FIGS. 15a and 15b depict different splitter orientations according to an embodiment of the invention.

It should be appreciated that two or more pulse modifiers may be disposed in series (cascaded). Because they make use of beam splitters to divide the beam, the finite thickness of the beam splitters causes a slight positional shift in the radiation beam as shown in FIG. 15a. The outgoing beam 100 is shifted by about 40 mm with respect to the incoming beam 100 when the beam splitters 10A, 10B of each pulse modifier are arranged to be parallel to each other.

Figure 15B:
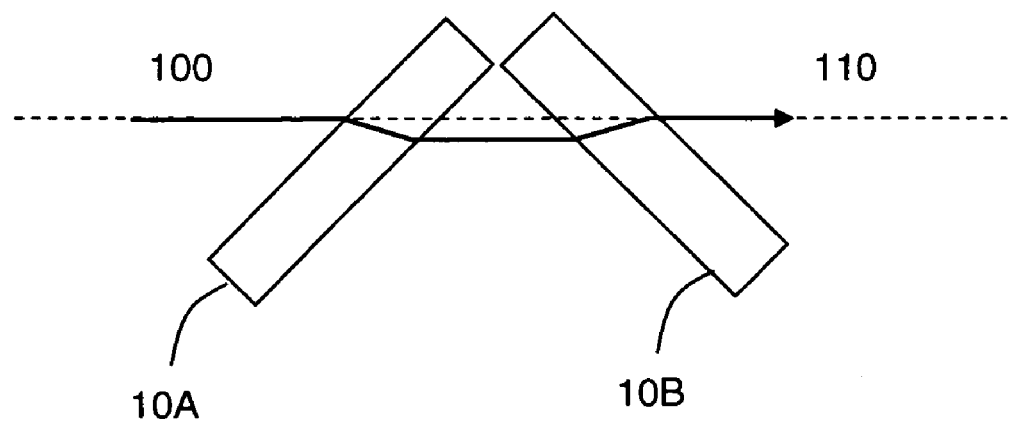

This shift may be reduced by orienting the beam splitters 10A, 10B to be approximately perpendicular to each other. As shown in FIG. 15b, the shift caused by beam splitter 10A is substantially corrected by the shift in the other direction by beam splitter 10B, and outgoing beam 110 is brought back in line with the incoming beam 100.

Figure 8A:
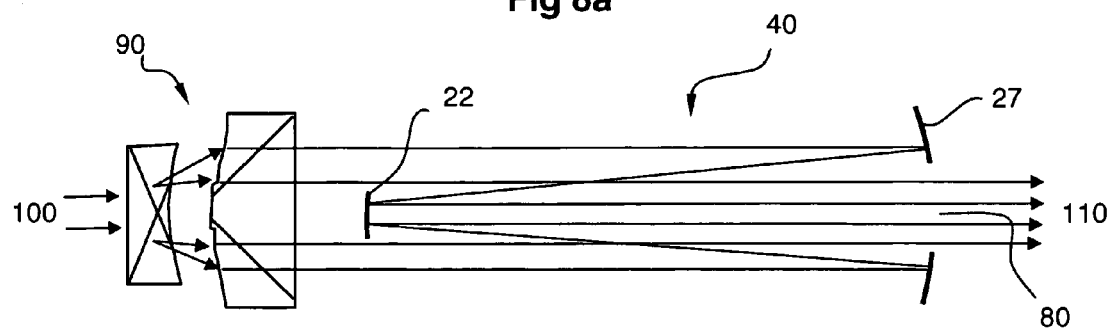
Figure 8A:
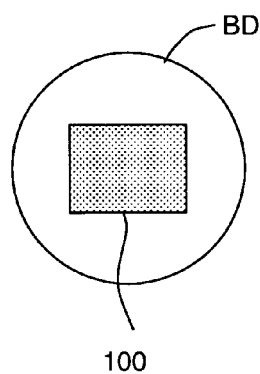
Figure 8A:
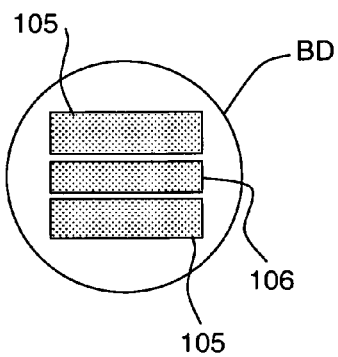
Figure 8A:
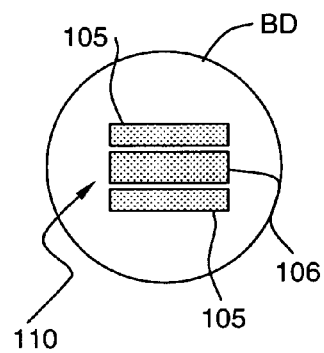
Figure 8A:
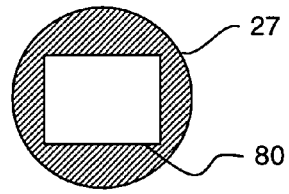
Figure 8A:
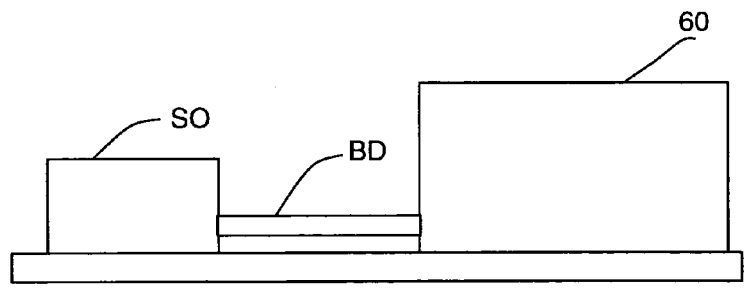

In another embodiment, a pulse stretching unit is provided which can be incorporated within a beam delivery unit BD without bending points as shown in FIG. 8f. The invention is shown schematically in FIGS. 8a to 8f. The pulse modifier includes a linear axicon 90, disposed in the path of an incoming pulsed radiation beam 100. The incoming radiation beam 100 has a rectangular intensity distribution as shown in FIG. 8b. An optical delay path 40 is formed by two mirrors 27, 22. Mirror 27 includes a rectangular aperture 80 as shown in FIG. 8e, whereby the aperture 80 has approximately the same dimensions as the incoming rectangular beam 100. The linear axicon 90 is further disposed such that the incoming radiation 100 is divided into two portions 105 which are directed towards mirror 27, and disposed such that a first portion of the radiation 105 leaves the pulse modifier through the aperture 80 into the outgoing radiation beam 110 and a second portion of radiation 105 is directed towards mirror 22. Mirror 22 is disposed such that the portion of radiation 105 from mirror 27 is redirected into the aperture 80 and thus out of the pulse modifier into a portion 106 of the output radiation beam 110.

The incoming beam 100 from the source SO enters the linear axicon 90, which redistributes the intensity of the radiation such that the radiation is concentrated towards the edge of the beam delivery BD in two rectangular portions 105. When the radiation from the linear axicon 90 reaches the mirror 27, a first part of the radiation 105 passes through the aperture 80 to form part 105 of the outgoing radiation beam 110, and part is reflected back along the delay path onto a second mirror 22. This part of the radiation is directed by mirror 22 through the aperture 80 in mirror 27, and forms a portion 106 of the outgoing beam 110. This delayed part of radiation thus travels an extra length approximately equal to twice the distance between mirrors 22 and 27. FIG. 8b shows the cross-section of the incoming beam 100, FIG. 8c depicts in cross-section the radiation 105 after division by the linear axicon 90 and the radiation 106 after reflection by the mirror 22, and FIG. 8d shows the outgoing radiation beam 110 including the undelayed portions 105 and the delayed portion 106. Note that the beam segments 105 and 106 are separated for clarity, but in practice the mirrors 22 and 27 can be configured and arranged to position the segments adjacent to each other. For example, if disposed in a 3 meter long beam delivery BD, this embodiment may stretch an incoming pulse of 50 ns to one with a TIS of 65 ns.

In a similar way to the other embodiments of the invention, the curvature of the mirrors 22 and 27, and the distance between them may be detuned from the expected optimum to reduce divergence of the beam.

Although this embodiment uses a linear axicon 90 to divide the beam, a geometrical divider may be also be employed as mentioned previously. The geometrical divider may include two mirrored surfaces which form a sharp point when seen in cross-section.

One feature of this embodiment is that the unit occupies little extra space compared to the installation without it. Floor space within a manufacturing facility is very limited as it is in the interest of the chip producer to get as much equipment as possible within a fixed space. Additionally, room needs to be reserved around each unit for access by service personnel. The ceiling height is also restricted due to e.g. ducting for various facilities or a limited height in the service area. Therefore, a pulse modifier which may be fitted in an existing unit is considerably useful.

Figure 9A:
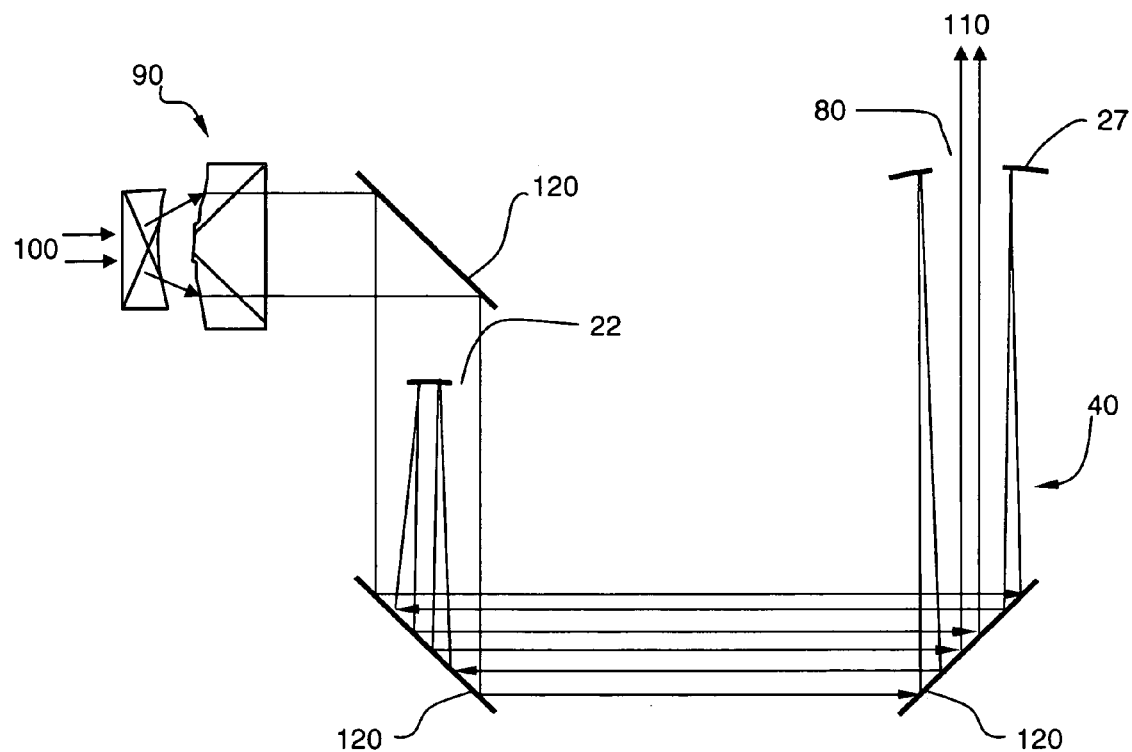
FIGS. 9a and 9b depict a pulse modifier according to an embodiment of the invention.
Figure 9B:
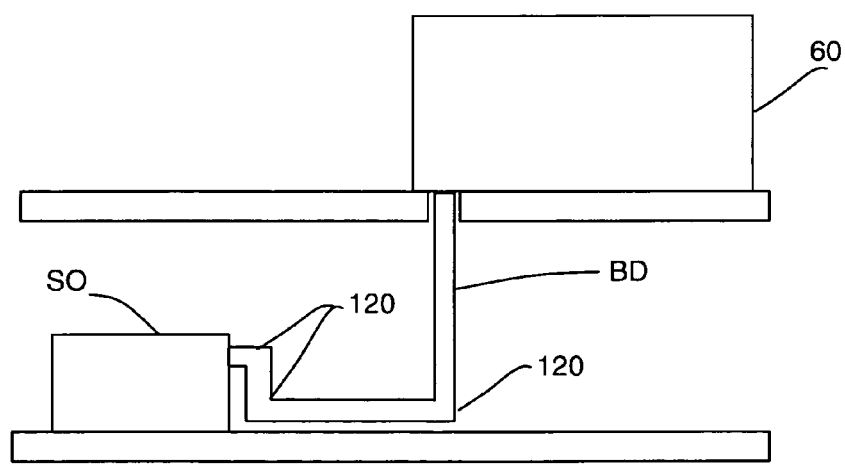

In a fourth embodiment, a pulse stretching unit is provided which can be incorporated within a beam delivery unit BD including bending points 120 as shown in FIG. 9b. The invention is shown schematically in FIG. 9a, and is similar to the embodiment shown in FIG. 8a, except for the addition of three bending points including a bending mirror 120. These may be almost-plane mirrors, with a slight curvature to correct any divergence due to the distance that the radiation travels. Additionally, it may be advantageous to provide one or more of the bending mirrors with active "steering" as mentioned previously to allow any remaining beam disturbance to be corrected.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the skilled artisan can easily employ the different methods of dividing the radiation where appropriate. Additional mirrors may also be employed to change the path of radiation through the pulse modifier.

The descriptions above are intended to be illustrative, not limiting. Thus, it will be apparent to one skilled in the art that modifications may be made to the invention as described without departing from the scope of the claims set out below.

What is claimed is:

1. A pulse modifier configured to receive an input pulse of radiation along a first optical axis and further configured to emit one or more corresponding output pulses of radiation along a second optical axis, the pulse modifier comprising:
    a divider disposed along the first optical axis and configured to divide the input pulse into a first and a second pulse portion, wherein the divider is further configured to direct the first pulse portion along the second optical axis; and
    a first mirror and a second mirror, each with a radius of curvature, disposed facing each other with a predetermined separation, configured to receive the second pulse portion and to redirect the second pulse portion along the second optical axis, wherein the optical path of the second pulse portion through the pulse modifier is longer than that of the first pulse portion, and the separation is less than the radius of curvature.

2. A pulse modifier according to claim 1, wherein the difference between the separation and the radius of curvature is more than 0.1 mm.

3. A pulse modifier according to claim 1, wherein the second portion is incident twice on each mirror.

4. A pulse modifier according to claim 1, wherein the divider is a beam splitter.

5. A pulse modifier according to claim 1, wherein the wavelength of radiation is selected from one of the following: 365 nm, 355 nm, 248 nm, 193 nm, 157 nm, 126 nm and in the range 5-20 nm.

6. A pulse modifier according to claim 5, wherein the radiation is 193 nm and the divider is a beam splitter including $CaF_2$.

7. A pulse modifier according to claim 1, wherein the Time Integral Square factor is greater than 1.5.

8. A pulse modification unit including two or more pulse modifiers according to claim 1, arranged in cascade such that the first optical axis of a pulse modifier coincides with the second optical axis of the preceding pulse modifier.

9. A pulse modification unit according to claim 8, wherein the Time Integral Square factor is greater than 2.

10. A pulse modification unit according to claim 8, wherein the difference between separation and radius of curvature for each pulse modifier is more than 0.1 mm.

11. A pulse modification unit according to claim 8, wherein the second portion of radiation in each pulse modifier is incident twice on each mirror of the pulse modifier.

12. A pulse modification unit according to claim 8, wherein the first mirror of all pulse modifiers is a common first mirror and the second mirror of all pulse modifiers is a common second mirror.

13. A pulse modification unit according to claim 12, wherein the difference between separation and radius of curvature for the common first and second mirrors is more than 0.1 mm.

14. A pulse modification unit according to claim 12, wherein the second portion of radiation in each pulse modifier is incident twice on each common mirror.

15. A pulse modification unit including two pulse modifiers, each pulse modifier configured to receive an input pulse of radiation along a first optical axis and further configured to emit one or more corresponding output pulses of radiation along a second optical axis, wherein the pulse modification unit comprises:
    a first divider, configured to divide the input pulse into a first and a second pulse portion, wherein the first divider is further configured to direct the first pulse portion towards a second divider;
    a first mirror and a second mirror, each with a radius of curvature, disposed facing each other with a predetermined separation, configured to receive the second pulse portion from the first divider and to redirect the second portion towards the second divider wherein the optical path of the second portion through the pulse modifier is longer than that of the first portion; and
    a second divider, configured to receive the pulses from the first divider and divide the pulses into a third and a fourth pulse portion, wherein the second divider is further configured to direct the third pulse portion along an optical axis, wherein the first and second mirrors are configured to receive the fourth pulse portion from the second divider and to redirect the fourth portion along the optical axis such that the optical path of the fourth portion through the pulse modifier is longer than that of the third portion.

16. A pulse modification unit according to claim 15, wherein the divider of each pulse modifier is a beam splitter and the angle between the longitudinal axes of the dividers is approximately 90 degrees.

17. A pulse modification unit according to claim 15, wherein the separation is less than the radius of curvature.

18. A pulse modification unit according to claim 15, wherein the difference between the separation and the radius of curvature is more than 0.1 mm.

19. A lithographic apparatus arranged to project a pattern from a patterning device onto a substrate, comprising:
- an illumination system configured to condition a radiation beam for illumination of the patterning device, wherein the illumination system includes a pulse modifier configured to receive an input pulse of radiation along a first optical axis and further configured to emit one or more corresponding output pulses of radiation along a second optical axis, the pulse modifier comprising
- a divider disposed along the first optical axis and configured to divide the incoming pulse into a first and a second pulse portion, wherein the divider is further configured to direct the first pulse portion along the second optical axis; and
- a first mirror and a second mirror, each with a radius of curvature, disposed facing each other with a predetermined separation, configured to receive the second pulse portion and to redirect the second portion along the second optical axis, wherein the optical path of the second portion through the pulse modifier is longer than that of the first portion, and the separation is less than the radius of curvature.

20. A pulse modifier configured to receive an input pulse of radiation along a first optical axis and further configured to emit one or more corresponding output pulses of radiation along a second optical axis, comprising:
- a divider, configured to divide the input pulse into first and second pulse portions, wherein the divider is further configured to direct the first and second pulse portions towards a first mirror having a radius of curvature, wherein the first mirror is disposed on the second optical axis and includes an aperture disposed along the second optical axis through which the one or more output pulses can pass, the first mirror being arranged to redirect a first part of each pulse portion towards a second mirror having a radius of curvature equal to that of the first mirror, and further arranged to pass a second part of each pulse portion through the aperture in the first mirror along the second optical axis as one or more output pulses, wherein the second mirror is disposed on the second optical axis facing the first mirror at a predetermined separation, and configured such that the optical path of the second part is longer than that of the first part.

21. A pulse modifier according to claim 20, wherein the separation is less than the radius of curvature.

22. A pulse modifier according to claim 20, wherein the difference between the separation and the radius of curvature is more than 0.1 mm.

23. A pulse modifier according to claim 20, wherein the divider includes a linear axicon.

24. A pulse modifier according to claim 20, wherein the divider includes a geometrical divider.

25. A lithographic apparatus arranged to project a pattern from a patterning device onto a substrate, comprising:
- an illumination system configured to condition a radiation beam for illumination of the patterning device, wherein the illumination system includes a pulse modifier configured to receive an input pulse of radiation along a first optical axis and further configured to emit one or more corresponding output pulses of radiation along a second optical axis, comprising
- a divider, configured to divide the input pulse into first and second pulse portions, wherein the divider is further configured to direct the first and second pulse portions towards a first mirror having a radius of curvature, wherein the first mirror is disposed on the second optical axis and includes an aperture disposed along the second optical axis through which the one or more output pulses can pass, the first mirror being arranged to redirect a first part of each pulse portion towards a second mirror having a radius of curvature equal to that of the first mirror, and further arranged to pass a second part of each pulse portion through the aperture in the first mirror along the second optical axis as one or more output pulses, wherein the second mirror is disposed on the second optical axis facing the first mirror at a predetermined separation, and configured such that the optical path of the second part is longer than that of the first part.

26. A lithographic apparatus according to claim 25, wherein the illumination system further includes a beam delivery system and the pulse modifier is disposed in the beam delivery system.

27. A pulse modifier configured to receive an input pulse of radiation along a first optical axis and further configured to emit one or more corresponding output pulses of radiation along a second optical axis, comprising:
- a divider, configured to divide the input pulse into first and second pulse portions, wherein the divider is further configured to direct the first pulse portion out of the pulse modifier as an output pulse; and
- a delay path including a first and a second optical element, configured to receive the second pulse portion and to redirect the second pulse portion out of the pulse modifier as an output pulse wherein the optical path of the second pulse portion is longer than that of the first pulse portion, wherein the separation between the first and second optical element is less than the paraxial resonant condition of the first and second optical elements such that the divergence of the output radiation beam is substantially the same as the divergence of the input radiation beam.

* * * * *